(12) United States Patent
Brooke et al.

(10) Patent No.: US 7,424,413 B2
(45) Date of Patent: Sep. 9, 2008

(54) METHOD FOR OPTIMIZING TURBINE ENGINE EXHAUST SYSTEM

(75) Inventors: Darrell Brooke, Cincinnati, OH (US); Keith E. J. Blodgett, Milford, OH (US)

(73) Assignee: General Electric Company, Schenectady, NY (US)

( * ) Notice: Subject to any disclaimer, the term of this patent is extended or adjusted under 35 U.S.C. 154(b) by 292 days.

(21) Appl. No.: 11/061,994

(22) Filed: Feb. 21, 2005

(65) Prior Publication Data
US 2006/0190220 A1 Aug. 24, 2006

(51) Int. Cl.
G06G 7/50 (2006.01)

(52) U.S. Cl. .............................................. 703/7; 703/1

(58) Field of Classification Search .................. 703/1, 703/6, 7, 9; 60/39.34, 805; 73/861, 861.33, 73/861.79, 861.84; 477/30, 53, 56; 701/100, 701/108
See application file for complete search history.

(56) References Cited

U.S. PATENT DOCUMENTS 4,532,809 A * 8/1985 Antonazzi et al. ............. 73/701
6,308,898 B1 * 10/2001 Dorris et al. ........... 239/265.17

OTHER PUBLICATIONS

Deere, K. A.; and Asbury, S. C.: An Experimental and Computational Investigation of a Translating Throat Single Expansion-Ramp Nozzle. AIAA-962540, Jul. 1996. http://citeseer.ist.psu.edu/deere96experimental.html.*

John R., C. 2003 A Nozzle Internal Performance Prediction Method. Technical Report. UMI Order No. rdp3221.tex., NASA Langley Technical Report Server., http://ntrs.nasa.gov/archive/nasa/casi.ntrs.nasa.gov/19920024381__1992024381.pdf.*

Karen A. Deere, PAB3D Simulations of a Nozzle With Fluidic Injection for Yaw Thrust-Vector Control , 34th. AIAA/ASME/SAE/ASEE Joint Propulsion Conference and Exhibit, Cleveland, Ohio, AIAA 98-3254, Jul. 13-15, 1998, http://citeseer.ist.psu.edu/deere98pabd.html.*

Edward J. Kowalski and Robert A Atkins Jr., "A Computer Code for Estimating Installed Performance of Aircraft Gas Turbine Engines", vol. III—Library of Inlet/Nozzle Configuration and Performance Maps, 1979, available from web site http://ntrs.nasa.gov/search.jsp?N=4294863541.*

K. Kinzie, M. Brown, D. Schein, and W. D. Solomon, Jr., "Measurements and Predictions for a Disturbed Exhaust Nozzle", 7th AIAA/CEAS Aeroacoustic Conf., May 28-30, 2001, 12pgs.

* cited by examiner

*Primary Examiner*—Paul L Rodriguez
*Assistant Examiner*—Luke Osborne
(74) *Attorney, Agent, or Firm*—Adams Intellectual Property Law, P.A.; William Scott Andes, Esq.

(57) ABSTRACT

A method for optimizing the efficiency of an exhaust system of a turbomachine, such as the nacelle of a gas jet turbine engine. The method includes the steps of selecting a plurality of turbomachine exhaust system parameters for comparative analysis, varying at least some of the parameters to define a plurality of discrete exhaust system configurations, and converting the plurality of exhaust system configurations to corresponding solid model forms. Corresponding geometric meshes are generated from the solid models, and CFD is carried out on each of the meshes to generate exhaust system performance data for each of the plurality of exhaust system configurations. The performance data is processed to provide comparisons of the exhaust system efficiency of each of the plurality of exhaust system configurations.

5 Claims, 8 Drawing Sheets

|   | FNE | CNE | THcc | Thplug | A19/A18 | A9/A8 | VNE | A18 | A8 |
|---|---|---|---|---|---|---|---|---|---|
|   | 1 | 2 | 3 | 4 |   |   |   |   |   |
| 1 | 282.85 | 322.17 | 13 | 16.6 |   |   |   |   |   |
| 2 | 282.85 | 322.17 | 13 | 18 |   |   |   |   |   |
| 3 | 282.85 | 322.17 | 13 | 20 |   |   |   |   |   |
| 4 | 282.85 | 322.17 | 15 | 18.6 | 1.0 |   |   |   |   |
| 5 | 282.85 | 322.17 | 15 | 20 |   |   |   |   |   |
| 6 | 282.85 | 322.17 | 15 | 22 |   |   |   |   |   |
| 7 | 282.85 | 322.17 | 17 | 20.6 |   |   |   |   |   |
| 8 | 282.85 | 322.17 | 17 | 22 |   |   |   |   |   |
| 9 | 282.85 | 322.17 | 17 | 24 |   |   |   |   |   |
| 10 | 282.85 | 327.17 | 13 | 16.6 |   |   |   |   |   |
| 11 | 282.85 | 327.17 | 13 | 18 |   |   |   |   |   |
| 12 | 282.85 | 327.17 | 13 | 20 |   |   |   |   |   |
| 13 | 282.85 | 327.17 | 15 | 18.6 |   |   |   |   |   |
| 14 | 282.85 | 327.17 | 15 | 20 |   |   |   |   |   |
| 15 | 282.85 | 327.17 | 15 | 22 |   |   |   |   |   |
| 16 | 282.85 | 327.17 | 17 | 20.6 |   |   |   |   |   |
| 17 | 282.85 | 327.17 | 17 | 22 |   |   |   |   |   |
| 18 | 282.85 | 327.17 | 17 | 24 |   |   |   |   |   |
| 19 | 282.85 | 332.17 | 13 | 16.6 |   |   |   |   |   |
| 20 | 282.85 | 332.17 | 13 | 18 |   |   |   |   |   |
| 21 | 282.85 | 332.17 | 13 | 20 |   |   |   |   |   |
| 22 | 282.85 | 332.17 | 15 | 18.6 |   |   |   |   |   |
| 23 | 282.85 | 332.17 | 15 | 20 |   |   |   |   |   |
| 24 | 282.85 | 332.17 | 15 | 22 |   |   |   |   |   |
| 25 | 282.85 | 332.17 | 17 | 20.6 |   |   |   |   |   |
| 26 | 282.85 | 332.17 | 17 | 22 |   |   |   |   |   |
| 27 | 282.85 | 332.17 | 17 | 24 |   |   |   |   |   |
| 28 | 287.85 | 322.17 | 13 | 16.6 |   |   |   |   |   |
| 29 | 287.85 | 322.17 | 13 | 18 |   |   |   |   |   |
| 30 | 287.85 | 322.17 | 13 | 20 |   |   |   |   |   |
| 31 | 287.85 | 322.17 | 15 | 18.6 | 1.0 |   |   |   |   |
| 32 | 287.85 | 322.17 | 15 | 20 |   |   |   |   |   |
| 33 | 287.85 | 322.17 | 15 | 22 |   |   |   |   |   |
| 34 | 287.85 | 322.17 | 17 | 20.6 |   |   |   |   |   |
| 35 | 287.85 | 322.17 | 17 | 22 |   |   |   |   |   |
| 36 | 287.85 | 322.17 | 17 | 24 |   |   |   |   |   |
| 37 | 287.85 | 327.17 | 13 | 16.6 |   |   |   |   |   |
| 38 | 287.85 | 327.17 | 13 | 18 |   |   |   |   |   |
| 39 | 287.85 | 327.17 | 13 | 20 |   |   |   |   |   |
| 40 | 287.85 | 327.17 | 15 | 18.6 |   |   |   |   |   |
| 41 | 287.85 | 327.17 | 15 | 20 |   |   |   |   |   |
| 42 | 287.85 | 327.17 | 15 | 22 |   |   |   |   |   |
| 43 | 287.85 | 327.17 | 17 | 20.6 |   |   |   |   |   |
| 44 | 287.85 | 327.17 | 17 | 22 |   |   |   |   |   |
| 45 | 287.85 | 327.17 | 17 | 24 |   |   |   |   |   |
| 46 | 287.85 | 332.17 | 13 | 16.6 |   |   |   |   |   |
| 47 | 287.85 | 332.17 | 13 | 18 |   |   |   |   |   |
| 48 | 287.85 | 332.17 | 13 | 20 |   |   |   |   |   |
| 49 | 287.85 | 332.17 | 15 | 18.6 |   |   |   |   |   |
| 50 | 287.85 | 332.17 | 15 | 20 |   |   |   |   |   |
| 51 | 287.85 | 332.17 | 15 | 22 |   |   |   |   |   |
| 52 | 287.85 | 332.17 | 17 | 20.6 |   |   |   |   |   |
| 53 | 287.85 | 332.17 | 17 | 22 |   |   |   |   |   |

DOE PARAMETER VARIATION

FNE=fan nozzle exit station
CNE=core nozzle exit station
THcc=core cowl angle
THplug=plug angle

FIG. 2

METHOD FOR OPTIMIZING TURBINE ENGINE EXHAUST SYSTEM

TECHNICAL FIELD AND BACKGROUND OF THE INVENTION

This invention relates to a method of optimizing the efficiency of the exhaust system of a turbomachine, for example, a gas turbine engine. Exhaust system optimization is an important factor in overall engine efficiency, particularly since even small improvements in exhaust system efficiency translate into large performance benefits for the engine. Prior art approaches to optimizing exhaust system efficiency rely on "rule of thumb" guidelines to provide guidance in determining exhaust system parameters. Limited computational fluid dynamics (CFD) and/or scale model testing has been used to help determine the best candidates for further testing and development. However, these approaches possess an inherent degree of unreliability and do not necessarily result in an optimized design, as well as also requiring a much longer period of time than is often permitted or possible within an overall development schedule.

The method disclosed and claimed herein provides the ability to generate a large number of realistic engine and engine component geometries at one time, to move quickly to a drafting model, and to pull together all information that are produced by the design-influenced gas flow fields.

According to one embodiment of the invention, a method for optimizing the efficiency of an exhaust system of a turbomachine includes the steps of selecting a plurality of turbomachine exhaust system parameters for comparative analysis, varying at least some of the parameters to define a plurality of discrete exhaust system configurations, and converting the plurality of exhaust system configurations to corresponding solid model forms. Corresponding parametric meshes are generated from the solid models and CFD is carried out on each of the meshes to generate exhaust system performance data for each of the plurality of exhaust system configurations. The performance data is processed to provide comparisons of the exhaust system efficiency of each of the plurality of exhaust system configurations.

BRIEF DESCRIPTION OF THE INVENTION

Therefore, one aspect of the invention is to provide a method of optimizing the efficiency of the exhaust system of a gas turbine engine.

BRIEF DESCRIPTION OF THE DRAWINGS

Some aspects of the invention have been set forth above. Other aspects and advantages of the invention will appear as the invention proceeds when taken in conjunction with the following drawings, in which:

FIG. 2 is table showing Design of Experiment parameter variations;

DESCRIPTION OF THE PREFERRED EMBODIMENT AND BEST MODE

Figure 1:
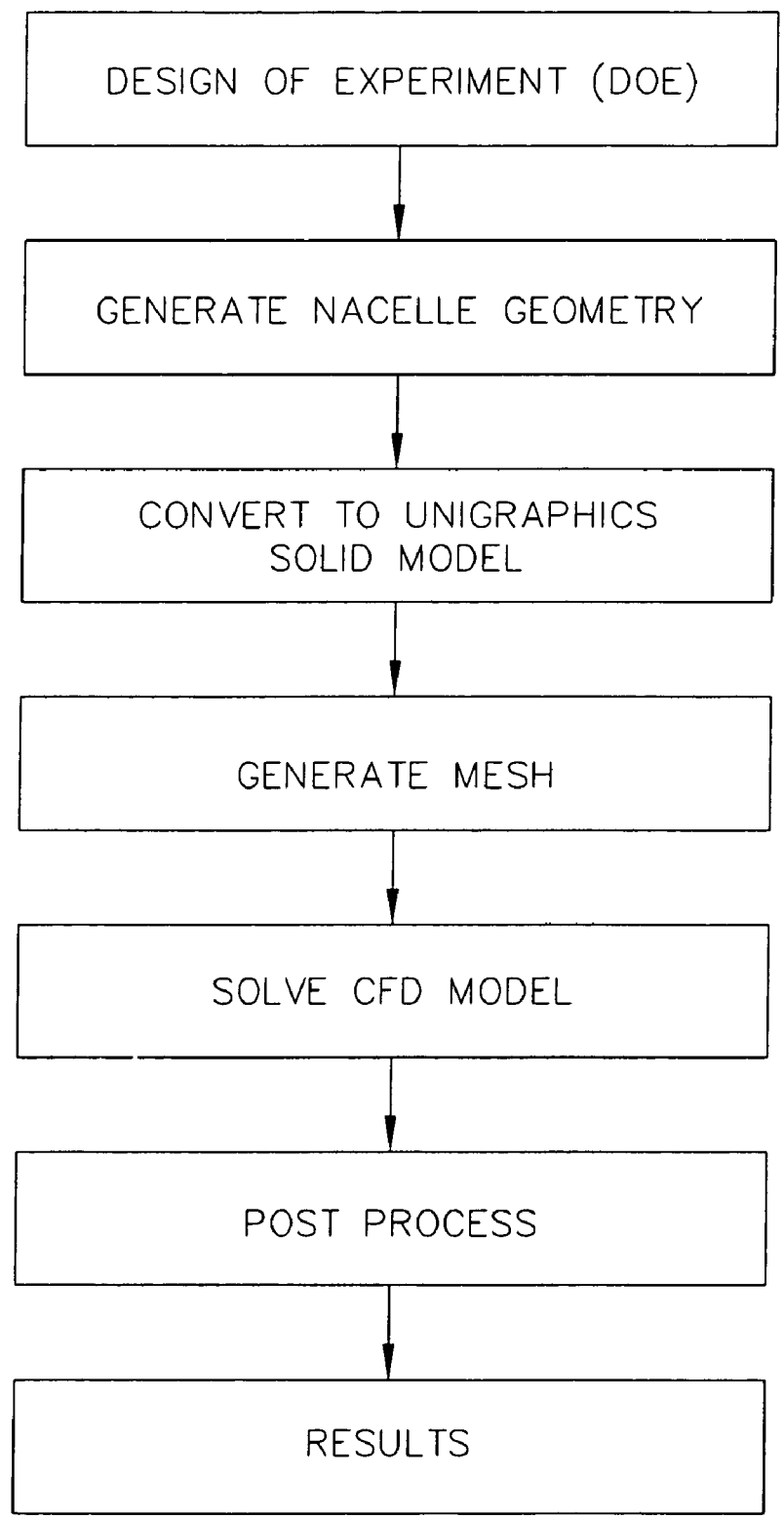
FIG. 1 is a flow diagram of the method according to an embodiment of the invention.

Referring now specifically to the drawings, a method of optimizing the efficiency of the exhaust system of a gas turbine engine according to the present invention is illustrated in FIG. 1.

In general, the method permits the rapid creation of parametric exhaust system designs as a basis of optimizing the design for predetermined desired criteria. A large number of parametric configurations can be generated in a matter of hours. The geometry output is processed through a program to create a context model that allows the rapid generation of meshes that are then used for the CFD coding. Then, the configurations are run through the CFD program to calculate the flows and pressures over the geometry. The solutions are then post-processed and the exhaust system charging station and exit nozzle coefficients are calculated. The charging station coefficients define the level of performance of each exhaust system, and the exit coefficients define the nozzle efficiencies. Design of Experiment (DOE) methodologies are used to identify the nature of the parametric variations needed to optimize the design.

Referring now more specifically to FIG. 1, DOE parameter variations are determined and entered into a DOE program. In the example shown in FIG. 2, the parameters are the fan nozzle exit station (FNE), core nozzle exit station (CNE), core cowl angle (THcc) and the plug angle (Thplug). Other geometric parameters that can be studied include fan and core nozzle area ratios, core cowl cooling vent location, among others.

Figure 3:
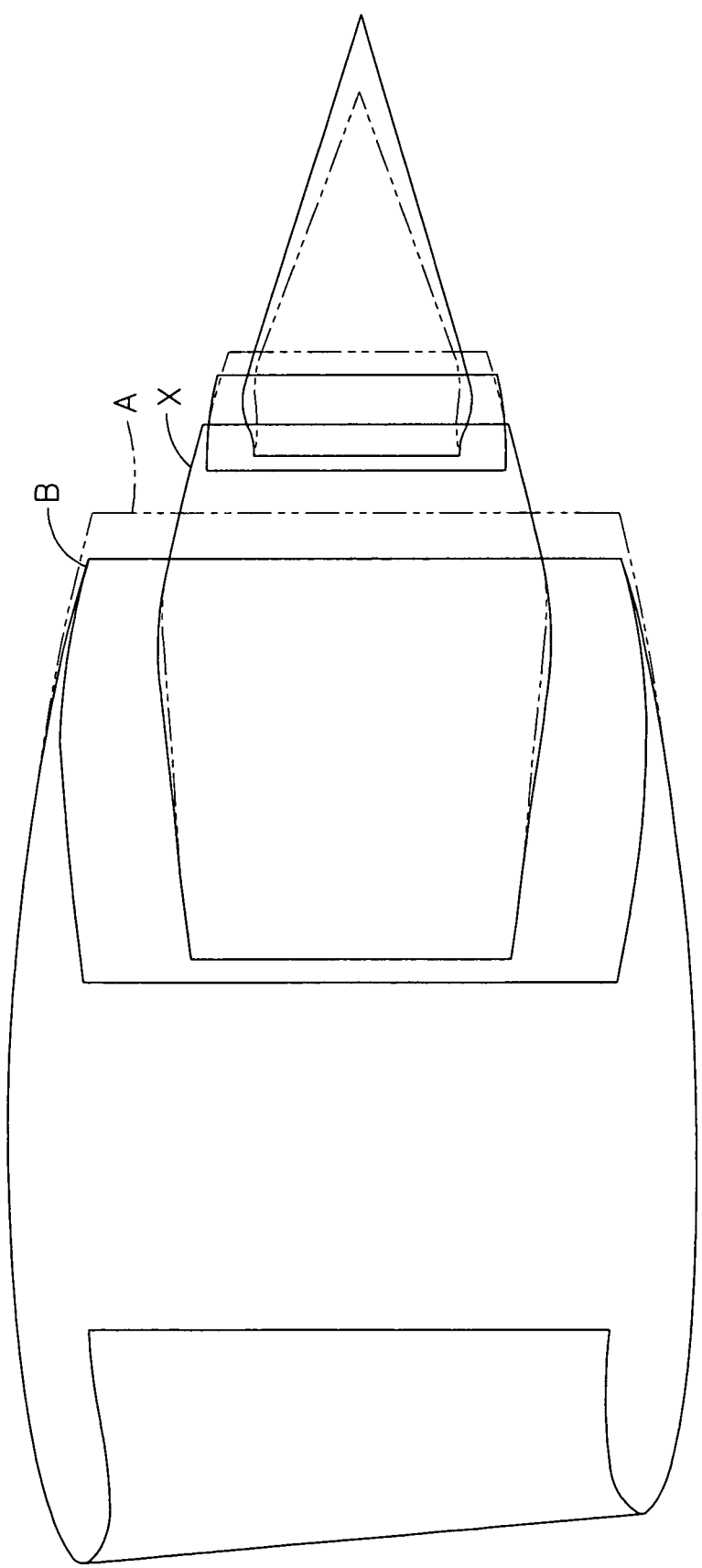
FIG. 3 is an outline view of two nacelle configurations having different exhaust system parameters.

Next, data entered into the DOE program are used to generate varying nacelle geometries, for example, 53 different geometries based on the data in the DOE program. Based on the data retrieved from the DOE program, geometries can be compared. For example, FIG. 3 illustrates a comparison of two different configurations having different exhaust system parameters, as is explained in further detail below.

Figure 4:
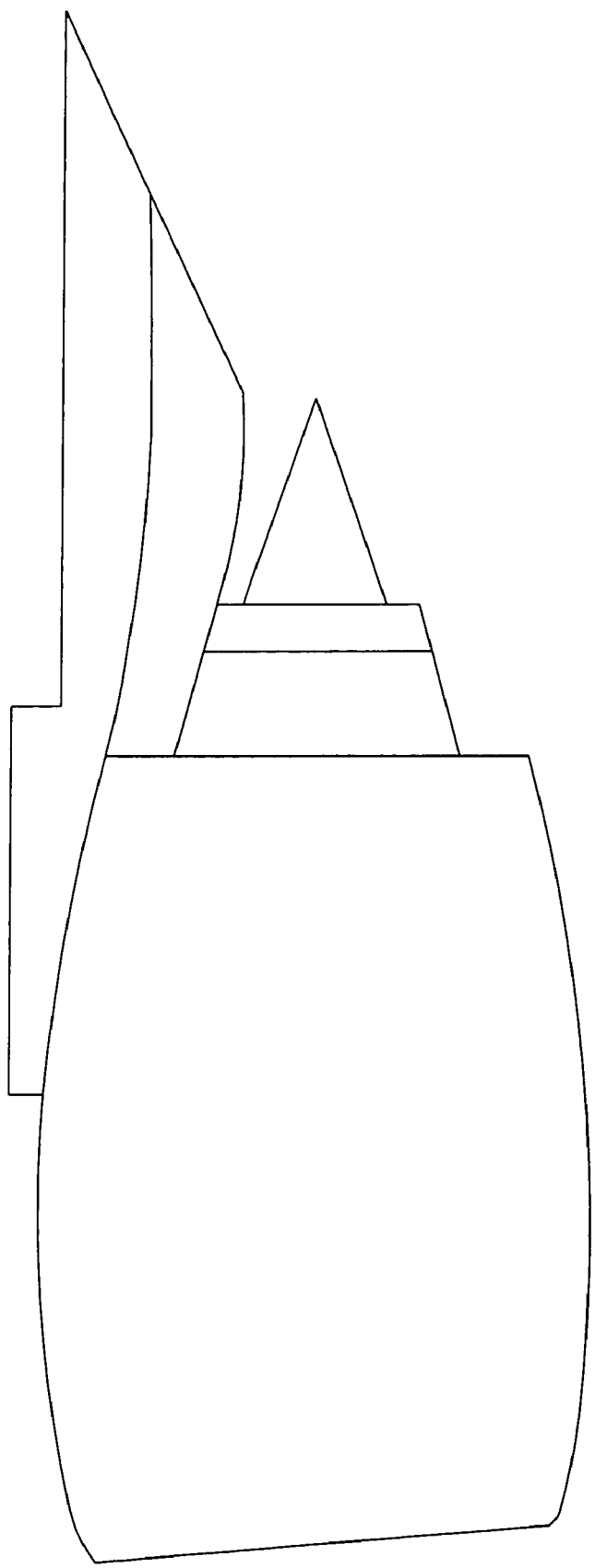
FIG. 4 is a side elevation of an engine nacelle solid model configuration.

Using conventional Unigraphics modeling software, the geometric parameters are converted into a representation of a solid model of the nacelle design, as shown in FIG. 4.

Figure 5:
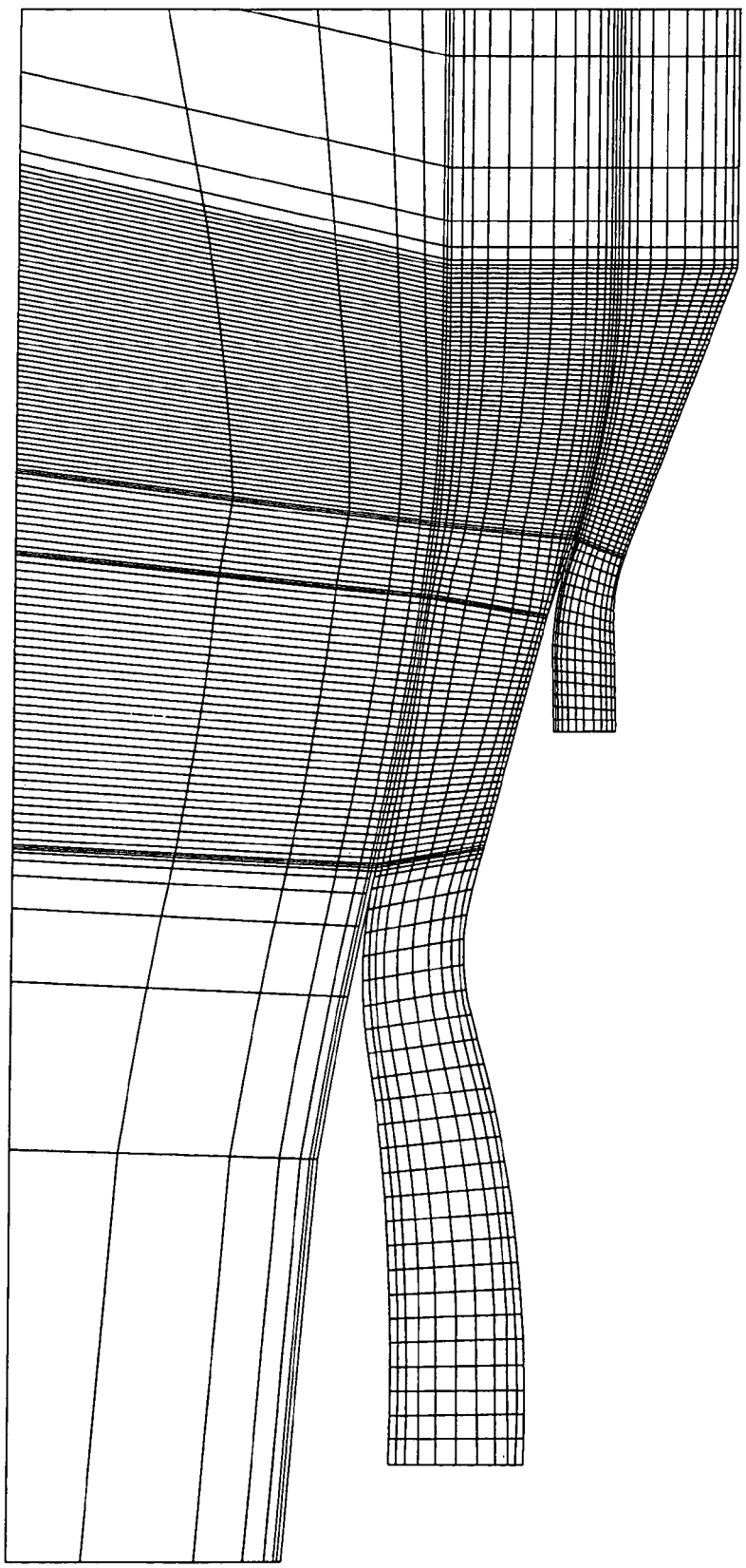
FIG. 5 is a mesh generated from a engine nacelle configuration.

From the solid model, a mesh of the nacelle design is created, as shown in FIG. 5. According to an embodiment of the method, CFD software developed by ICEM CFD Engineering of Berkeley, Calif. is used. This software allows original 3D Computer Aided Design (CAD) geometry to be used instead of building separate analysis models. The software generates grids from geometry in multi-block structured, unstructured hexahedral, tetrahedral, hybrid cells consisting of hexahedral, tetrahedral, pyramidal and prismatic cells, and Cartesian grid formats combined with boundary conditions. The ICEM software permits input from standard formats such as IGES or DXF, direct interfaces such as Unigraphics (used herein) or unstructured interfaces such as STL and PLOT3D.

Figure 6:
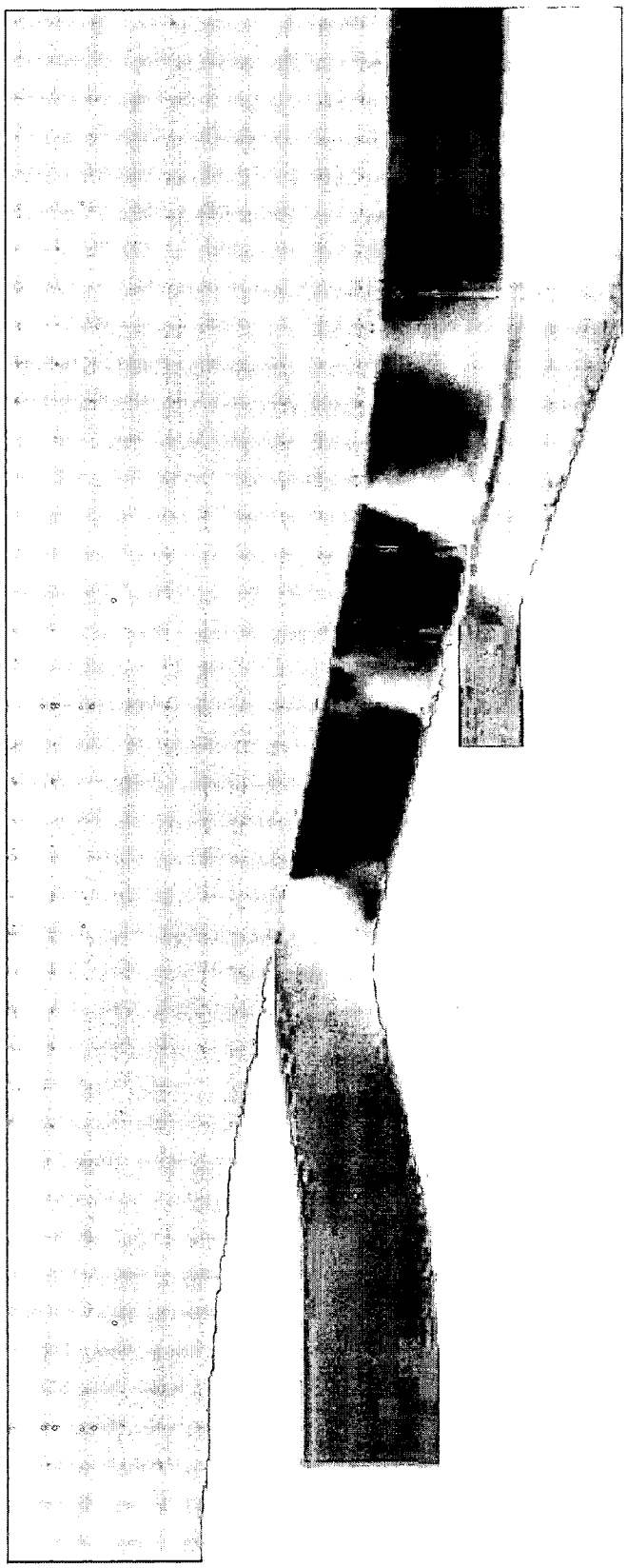
FIG. 6 is a fragmentary side elevation of the mesh of FIG. 5 solved based on CFD computations.

As is shown generally in FIG. 1 and in detail in FIG. 6, CFD software sold by Analytical Services and Materials, Inc. under the trademark PAB3D is then used to solve complex equations from the meshed nacelle designs. PAB3D solves three-dimensional Reynolds-averaged Navier-Stokes equations with a finite-volume formulation on multi-block grids, such as the mesh created in the previous method step. PAB3D was developed to predict internal and external performance of nozzle-afterbody configurations. FIG. 6 illustrates flow field Mach number distribution calculated by the PAB3D software.

Post processing comprises utilizing the solutions computed by the PAB3D program to extract data regarding predicted forces and gas flows and automatic generation of nozzle coefficients. These results can be imported into a spreadsheet program to allow detailed comparison of numerous designs. This greatly facilitates the development of greater understanding of the effect of physical changes in nacelle configuration on thrust and drag producing components.

Referring back to FIG. 3, two nacelle configurations are shown in an overlaid position. The nacelle A in dashed lines represents a baseline nacelle configuration, and nacelle B in solid lines represents a modified configuration that, after analysis according to the described method, provides enhanced exhaust system efficiency. In comparison to the baseline nacelle design A, the improved nacelle design B has a longer fan duct, shown at X, a lower core cowl angle, and a lower plug angle. These design modifications resulted in less scrub area, less fan duct energy loss, less turning loss, better pressure recovery on the core cowl and plug, and improved vent location.

Figure 7:
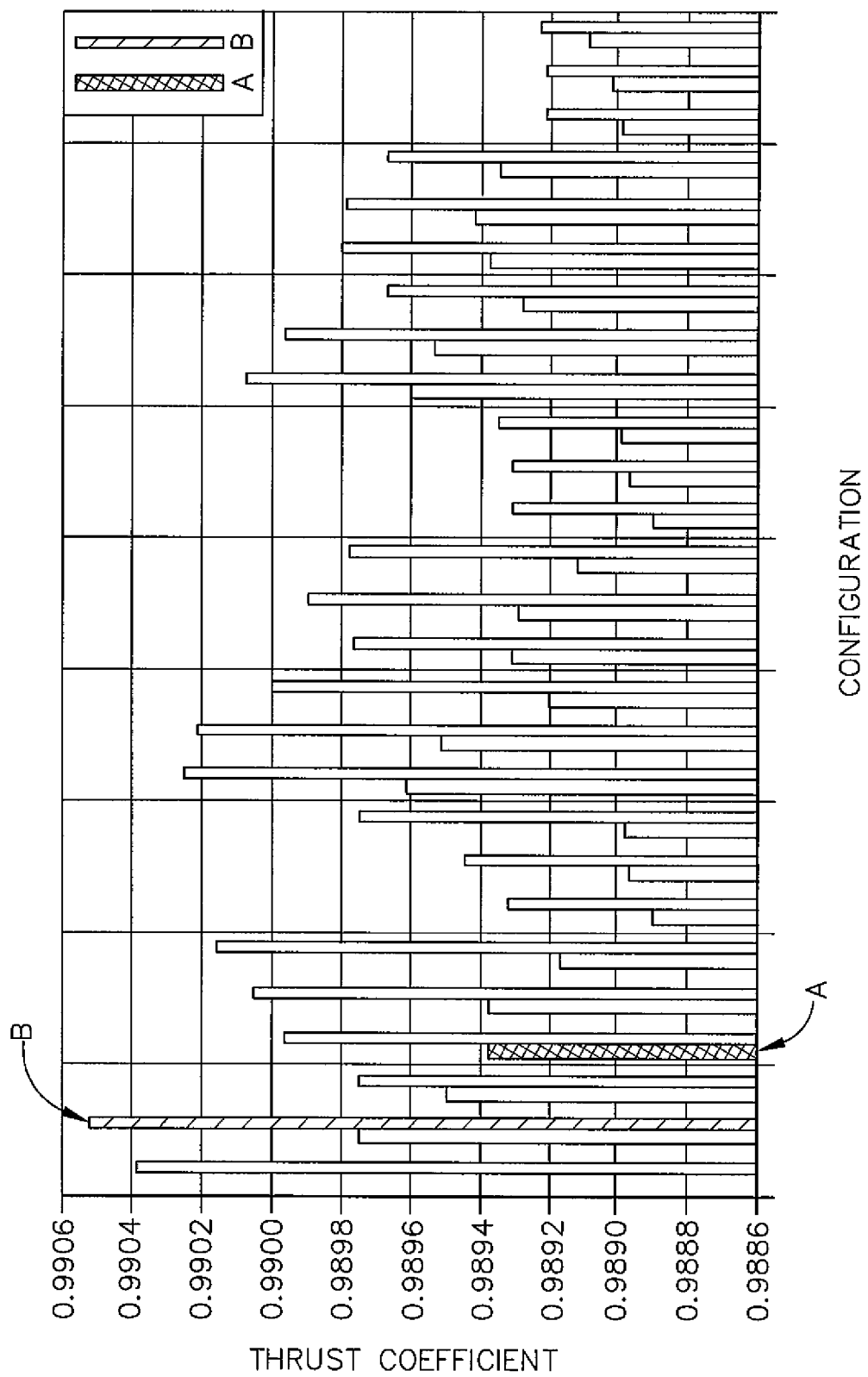
FIG. 7 is a graph showing thrust coefficients in relation to engine nacelle configuration parameters.

As is shown in FIG. 7, the 53 design variations have been plotted on a graph. Configuration A on FIG. 7 represents the baseline nacelle configuration A shown in FIG. 3, and nacelle configuration B on FIG. 7 represents the nacelle configuration B on FIG. 3. The results show a higher thrust coefficient for nacelle configuration B, indicative of the most efficient nacelle design. As can be noted on FIG. 7, post processing of the PAB3D solutions provides an efficient and visually-meaningful way of quickly evaluating the relative efficiency of many different nacelle designs without scale modeling or application of "rule of thumb" criteria that themselves may be unreliable.

Figure 8:
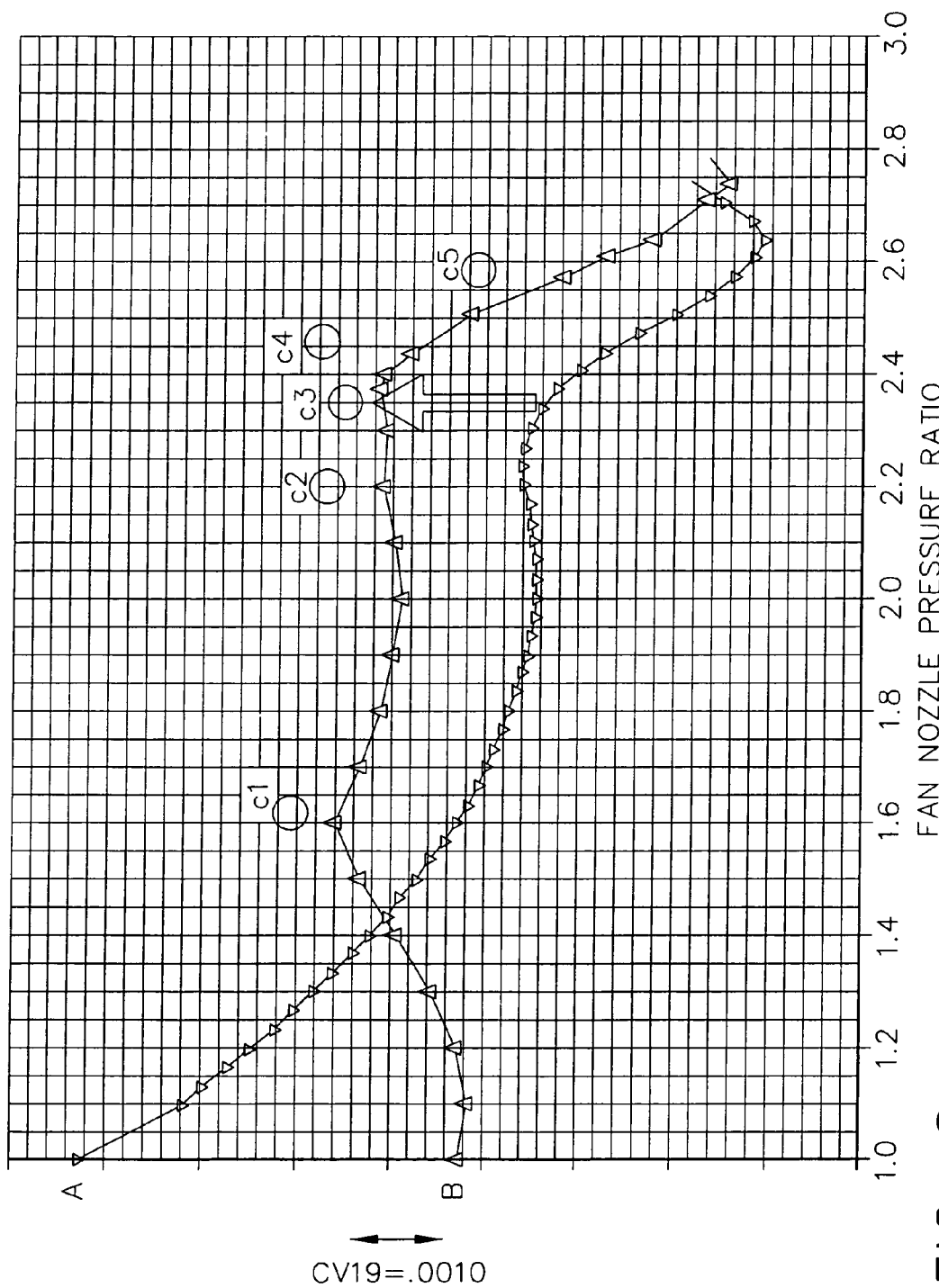
FIG. 8 is a graph showing scale model data for a model designed using the method according to the invention for best configuration verification.

Validation of results can be seen on FIG. 8. Here, a baseline nacelle configuration, graph line A, indicates data generated from scale model testing. Graph line B plots data generated by the method according to the invention as described herein. Graph line B represents an optimized nacelle configuration, in that it shows that the fan nozzle exit velocity (thrust) coefficient for the graph line B is greater over most of the fan nozzle pressure ratio range than the baseline nacelle represented by graph line A.

By then developing and testing a scale model based on the nacelle design represented by graph line B, it can be seen from the plotted points $C^1$ through $C^5$ that the actual physical testing of the configuration with a scale model closely tracks the results predicted by the method of the invention.

The above comparison is further analyzed and indicates that the optimized nacelle configuration provides a 0.20 to 0.25 percent improvement in overall thrust coefficient over the baseline nacelle configuration, and a specific fuel consumption improvement of 0.6 to 0.8 percent over the worst configurations. While modest in absolute terms, even improvements on this scale can translate into significant performance improvements and enormous savings in fuel costs over the life of a modern jet turbine engine.

A method for optimizing the efficiency of the exhaust system of a gas turbine engine is described above. Various details of the invention may be changed without departing from its scope. Furthermore, the foregoing description of the preferred embodiment of the invention and the best mode for practicing the invention are provided for the purpose of illustration only and not for the purpose of limitation—the invention being defined by the claims.

We claim:

1. A method for optimizing the efficiency of an exhaust system of a gas turbine engine including a nacelle, comprising:
   (a) selecting a plurality of nacelle parameters from the group consisting of the fan nozzle exit station (FNE), the core nozzle exit station (CNE), the core cowl angle (THcc), the plug angle (Thplug), the fan nozzle area ratio, the core nozzle area ratio and the core cowl cooling vent location;
   (b) holding at least one of the FNE and the CNE constant and varying at least one of the THcc and the Thplug to define a plurality of discrete exhaust system configurations;
   (c) converting the exhaust system configurations to corresponding solid models;
   (d) generating a corresponding mesh from each of the solid models;
   (e) performing a Computational Fluid Dynamics (CFD) analysis on each mesh to generate exhaust system performance data for each of the exhaust system configurations;
   (f) processing the exhaust system performance data to determine a thrust coefficient for each of the plurality of exhaust system configurations; and
   (g) comparing the thrust coefficients of at least two of the exhaust system configurations and selecting the exhaust system configuration having the greatest thrust coefficient.

2. A method according to claim 1, further comprising:
   (a) selecting at least one optimized nacelle configuration based on the results of the CFD analysis;
   (b) selecting a baseline nacelle configuration having a known thrust coefficient; and
   (c) comparing the thrust coefficient of the optimized nacelle configuration and the known thrust coefficient of the baseline nacelle configuration to determine the greatest thrust coefficient.

3. A method according to claim 2, further comprising validating the thrust coefficient of the optimized nacelle configuration by:
   (a) constructing a scale model nacelle in accordance with the parameters of the optimized nacelle configuration; and
   (b) determining an actual thrust coefficient for the optimized nacelle configuration by testing the scale model nacelle.

4. A method according to claim 1, wherein the step of processing the exhaust system performance data to determine thrust coefficients for each of the plurality of exhaust system configurations comprises plotting the data on a bar graph.

5. A method according to claim 1, wherein performing the CFD analysis on each mesh to generate exhaust system performance data for each of the plurality of exhaust system configurations comprises solving one or more three-dimensional Reynolds-averaged Navier-Stokes equations with a finite-volume formulation on the mesh.

* * * * *